US005995375A

United States Patent [19]

Miyazawa et al.

[11] Patent Number: 5,995,375
[45] Date of Patent: *Nov. 30, 1999

[54] CELL HOLDER UNIT AND ELECTRONIC DEVICE USING SUCH

[75] Inventors: Kenichi Miyazawa; Hiroo Naeki, both of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/665,795

[22] Filed: Jun. 18, 1996

[30] Foreign Application Priority Data

Aug. 22, 1995 [JP] Japan .................................. 7-213346

[51] Int. Cl.⁶ .............................. H01M 2/20; H02J 9/00
[52] U.S. Cl. ........................... 361/782; 307/64; 439/500; 429/100; 429/121; 429/123
[58] Field of Search ..................................... 361/782, 679, 361/683, 760; 429/100, 121, 123; 439/500; 320/2, 103, 107, 110, 126, 134; 307/150, 46, 48, 64, 65, 66; 206/703, 704

[56] References Cited

U.S. PATENT DOCUMENTS 3,959,706  5/1976  Mabuchi et al. .................. 320/103
4,464,445  8/1984  Matti ................................. 429/100
5,296,315  3/1994  Rein .................................. 429/100
5,578,876  11/1996 Crampton ......................... 307/66

FOREIGN PATENT DOCUMENTS 60-146449  8/1985  Japan .

*Primary Examiner*—Leo P. Picard
*Assistant Examiner*—John B. Vigushin
*Attorney, Agent, or Firm*—Nikaido, Marmelstein, Murray & Oram LLP

[57] ABSTRACT

A cell holder unit includes a cell holder in which a cell is removably set, having a first electrode and a second electrode which are respectively in contact with electrodes of the cell set therein, a dummy cell which can be set in another cell holder, having a first electrode and a second electrode which are respectively in contact with electrodes of the other cell holder when the dummy cell is set in the other cell holder, and a connecting mechanism which electrically connects the first and second electrodes of the cell holder and the first and second electrodes of the dummy cell respectively.

13 Claims, 5 Drawing Sheets

CELL HOLDER UNIT AND ELECTRONIC DEVICE USING SUCH

BACKGROUND OF THE INVENTION (1) Field of the Invention

The present invention relates to a cell holder unit and an electronic device using the cell holder, and, more particularly, to a cell holder unit connectable to another cell holder mounted on a circuit board and an electronic device in which the cell holder unit is connected to another cell holder mounted on a circuit board.

(2) Description of the Related Art

It is uneconomical to design dedicated parts for each of the various types of electronic devices, such as specific-purpose computers, POS terminals, devices for office automation or communication devices. Thus, in many cases, circuit boards having functions required for an electronic device are selected from among commercially available circuit boards, such as so-called PC boards, having various functions, and the electronic device is manufactured using the selected circuit boards. In some of such commercially available circuit boards, back-up batteries for memories and/or internal timers are required. Each of the back-up batteries is used to maintain data in a memory and to maintain an operation of a timer while a main power supply of a circuit board is in an off state.

In general, the back-up cell (e.g., a lithium cell) is set in a cell holder mounted on the commercially available circuit board. The back-up cell is periodically changed or changed during maintenance performed on demand. A position at which the cell holder is mounted on the commercially available circuit board is independently designed by a maker of the circuit board. That is, the commercially available circuit board is not designed for a specific electronic device. Thus, even if commercially available circuit boards have the same function, positions at which the cell holders are mounted on the commercially available circuit boards may differ from each other.

As a result, in an electronic device manufactured using the commercially available circuit board, the back-up cell is not necessarily located at a position at which the back-up cell is easily removed from and set in the cell holder.

For example, as shown in FIG. 1, a POS terminal 30 (an electronic device) is formed. Referring to FIG. 1, a circuit board 12 which is a commercially available circuit board having functions required for the POS terminal 30 and a power supply unit 32 are housed in a lower case 31. A cell holder 14 is mounted on the circuit board 12.

A back-up cell 15 (e.g., a lithium cell) is removably set in the cell holder 14. The lower case 31 is covered by an upper cover 34. A keyboard 41, a printer unit 42 and a display unit 43 are placed on the upper cover 34. A front panel 33 is fixed on a front surface of the lower case 31.

To change the back-up cell 15 which has deteriorated with time, the front panel 33 and the upper cover 34 on which the keyboard 41, the printer unit 42 and the display unit 43 are placed must be removed from the lower case 31 so that the lower case 31 is opened. In a state where the lower case 31 is opened, the back-up cell 15 is removed from the cell holder 14 and a new back-up cell is set in the cell holder 14. That is, complicated work is needed to change the back-up cell 15.

A high-performance cell may be developed. In this case, since the cell holder 14 is directly fixed on the circuit board 12, if a configuration of the developed cell differs from that of the conventional back-up cell 15, the developed cell is hardly used as the back-up cell.

SUMMARY OF THE INVENTION

Accordingly, a general object of the present invention is to provide a novel and a useful cell holder unit in which the disadvantages of the aforementioned prior art are eliminated.

A specific object of the preset invention is to provide a cell holder unit by which a cell used for a circuit board in an electronic device can be easily changed.

Another object of the present invention is to provide a cell holder unit by which a cell having a new configuration can be easily used for a circuit board in an electronic device.

The above objects of the present invention are achieved by a cell holder unit comprising: a cell holder in which a cell is removably set, having a first electrode and a second electrode which are respectively in contact with electrodes of the cell set therein; a unit which can be set in another cell holder, having a first electrode and a second electrode which are respectively in contact with electrodes of the another cell holder when the unit is set in the another cell holder; and a connecting mechanism which electrically connects the first and second electrodes of the cell holder and the first and second electrodes of the unit respectively.

According to the present invention, the unit can be set in the another cell holder mounted in a circuit board of an electronic device, and the cell holder can be located, in the electronic device, at a position at which the cell can be easily set in and removed from the cell holder. Thus, a cell used with a circuit board in an electronic device can be easily changed.

In addition, the cell holder can be designed and made so that a cell having a new configuration is fitted to the cell holder. Thus, a cell having a new configuration can be easily used for a circuit board in an electronic device.

Another object of the present invention is to provide an electronic device in which the cell holder unit described above is used.

The object of the present invention is achieved by an electronic device having a circuit board on which a first cell holder is mounted, circuitry formed on the circuit board having functions which are applicable to the electronic device, the electronic device comprising: a second cell holder in which a cell is removably set, having a first electrode and a second electrode which are respectively in contact with electrodes of the cell set therein; a unit which can be set in the first cell holder, having a first electrode and a second electrode which are respectively contact with electrodes of the first cell holder when the unit is set in the first cell holder; and a connecting mechanism which electrically connects the first and second electrodes of the second cell holder and the first and second electrodes of the unit respectively.

According to the present invention, an electronic device in which the cell holder unit described above is used can be provided.

BRIEF DESCRIPTION OF THE DRAWINGS

Other objects, features and advantages of the present invention will be apparent from the following description when read in conjunction with the accompanying drawings, in which.

DETAILED DESCRIPTION OF THE PREFERRED EMBODIMENTS

A description will be given of an embodiment of the present invention.

Figure 2:
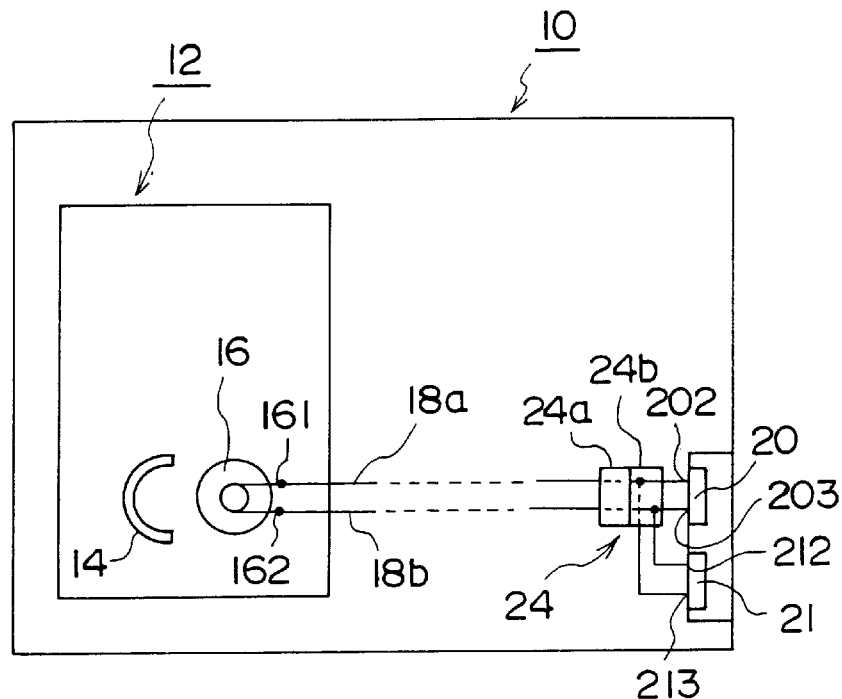
FIG. 2 is a diagram illustrating a cell holder unit according to an embodiment of the present invention.

A cell holder unit according to an embodiment of the present invention is formed as shown in FIG. 2. Referring to FIG. 2, the circuit board 12 which is a commercially available circuit board is located at a predetermined position in an electronic device 10. The cell holder 14 for a back-up cell and other electronic elements, such as a CPU, memories, resistors, capacitors and the like (not shown), are mounted on the circuit board 12. A configuration of the cell holder 14 and a position at which the cell holder 14 is mounted on the circuit board 12 are independently designed by a manufacturer of the circuit board 12. The electronic device 10 is further provided with other units, such as a keyboard, a display unit, a printer unit and the like (not shown). A cell holder unit is formed as follows.

Figure 3A:
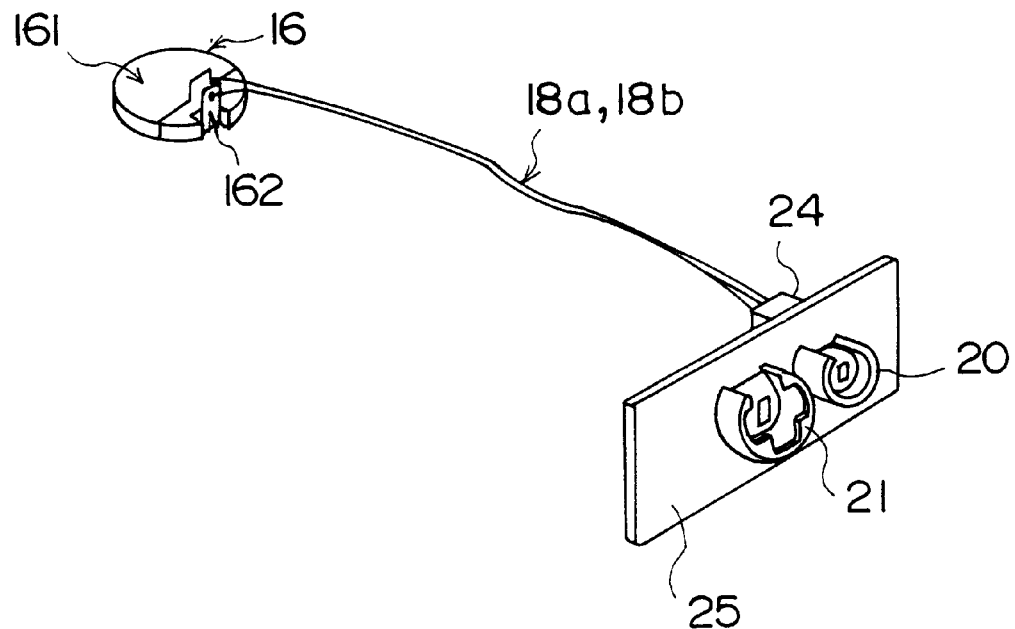
FIG. 3A is a perspective view showing the cell holder unit.

The cell holder unit has a dummy cell 16 and cell holders 20 and 21. The dummy cell 16 is electrically connected to the cell holders 20 and 21 via lead wires 18a and 18b and a connector 24. The cell holders 20 and 21 are mounted on a supporting circuit board 25 as shown in FIG. 3A. The supporting circuit board 25 is fixed on a housing of the electronic device 10 so that batteries set in the cell holders 20 and 21 can be easily changed without touching the circuit board 12 in the housing.

Figure 3B:
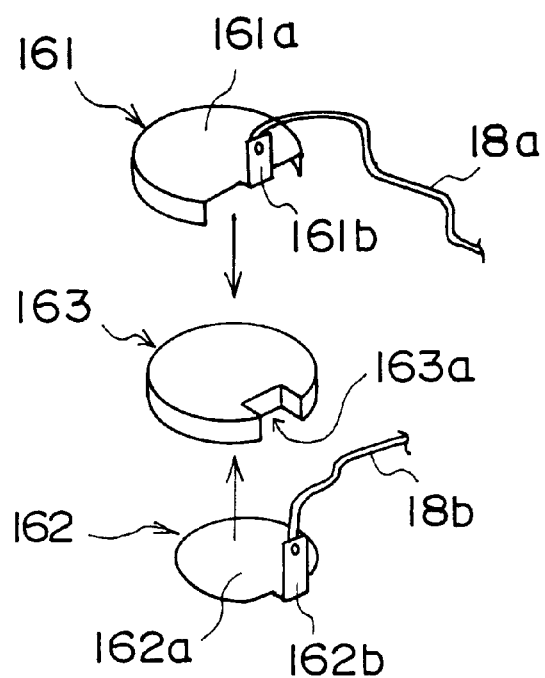
FIG. 3B is a exploded perspective view showing a structure of a dummy cell used in the cell holder unit shown in FIG. 3A.

The dummy cell 16 has a configuration so as to fit in the cell holder 14 mounted on the circuit board 12. That is, the dummy cell 16 is formed as shown in FIG. 3B. Referring to FIG. 3B, the dummy cell 16 has a positive-electrode member 161, a negative-electrode member 162 and a button-shaped body 163. The button-shaped body 163 is made of an insulating material and has a configuration similar to that of a cell (e.g., a lithium cell) which is set in the cell holder 14 mounted on the circuit board 12. A notch 163a is formed on a side surface of the button-shaped body 163. The positive-electrode member 161 and the negative-electrode member 162 are made of metal (e.g., copper). The positive-electrode member 161 has a cap portion 161a and a terminal portion 161b which projects from the cap portion 161a in a direction perpendicular to a main surface of the cap portion 161a. The negative-electrode member 162 has a plate portion 162a and a terminal portion 162b which projects from the plate portion 162a in a direction perpendicular to the plate portion 162a. The cap member 161a of the positive-electrode member 161 and the plate portion 162a of the negative-electrode member 162 are respectively adhered to different surfaces of the button-shaped body 163 so as to be separated from each other. The terminal portion 161b of the positive-electrode member 161 and the terminal portion 162b of the negative-electrode member 162 which is engaged in the notch 163a of the button-shaped body 163 face each other at an interval. The ends of the lead wires 18a and 18b are respectively fixed on the terminal portions 161b and 162b of the positive-electrode member 161 and the negative-electrode member 162 by solder. In a state where the dummy cell 16 is set in the cell holder 14, the cap portion 161a of the positive-electrode member 161 and the plate portion 162a of the negative-electrode member 162 are respectively in contact with a positive-electrode and a negative-electrode of the cell holder 14.

Figure 4A:
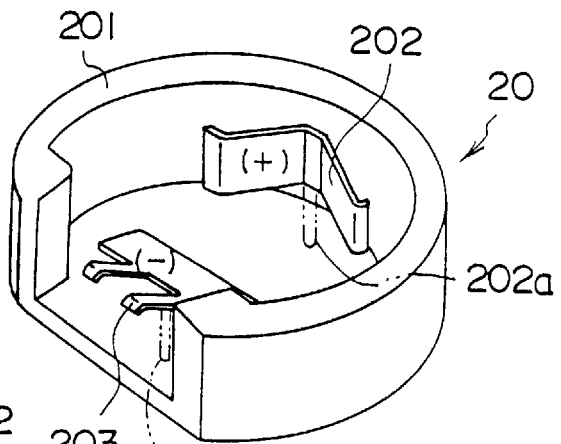
FIG. 4A is a perspective view showing a cell holder used in the cell holder unit shown in FIG. 3A.

A cell holder in which a cell decided to be used for the electronic device 10 is fitted is designed and made or selected from commercially available cell holders, as each of the cell holders 20 and 21 mounted on the supporting circuit board 25. Each of the cell holders 20 and 21 is formed as shown in FIG. 4A. FIG. 4A shows only the cell holder 20. The cell holders 20 and 21 have the same structures. Thus, only the cell holder 20 will be explained with reference to FIG. 4A.

Figure 4B:
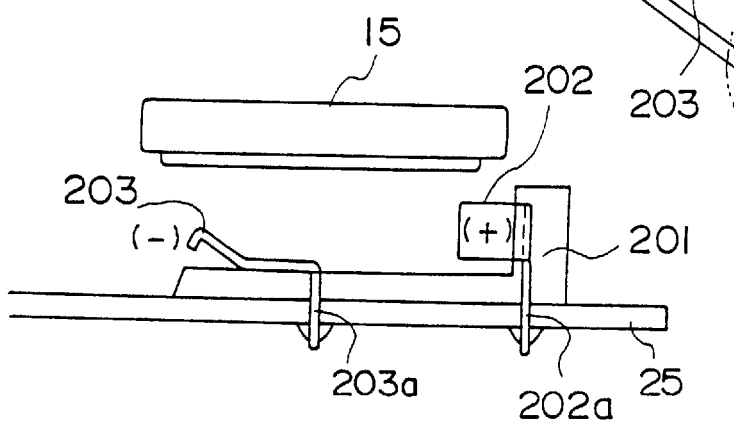
FIG. 4B is a cross sectional view showing the cell holder shown in FIG. 4A which cell is mounted on a circuit board.

Referring to FIG. 4A, the cell holder 20 has a holder body 201, a positive-electrode plate 202 and a negative-electrode plate 203. The holder body 201 has a concave portion in which the cell is to be set. The positive-electrode plate 202 and the negative-electrode plate 203 are fixed at positions in the concave portion of the holder body 201 so as to be in contact with corresponding electrodes of the cell set in the holder body 201. The positive-electrode plate 202 and the negative-electrode plate 203 respectively have pins 202a and 203a which project from the bottom surface of the holder body 201. As shown in FIG. 4B, the pins 202a and 203a pass through the supporting circuit board 25, ends of the pins 202a and 203a are fixed on a circuit pattern by solder, and the holder body 201 of the cell holder 20 is fixed on the supporting circuit board 25. When the cell 15 is set in the holder body 201, the cell 15 is electrically connected to the circuit pattern on the supporting circuit board 25 via the positive-electrode plate 202 and the negative-electrode plate 203.

Returning to FIG. 2, the connector 24 is formed of a first connector element 24a and a second connector element 24b both of which can be connected to and separated from each other. The lead wires 18a and 18b extending from the dummy cell 16 are connected to the first connector element 24a. A set of the positive-electrode plate 202 and the negative-electrode plate 203 of the cell holder 20 and a set of the positive-electrode plate 212 and the negative-electrode plate 213 of the cell holder 21 are connected to the second connector element 24b in parallel. In a state where the first and second connector elements 24a and 24b are connected to each other, the positive-electrode member 161 and the positive-electrode plates 202 and 212 of the cell holders 20 and 21 are electrically connected to each other, and the negative-electrode member 162 and the negative-electrode plates 203 and 213 of the cell holders 20 and 21 are electrically connected to each other.

Figure 5:
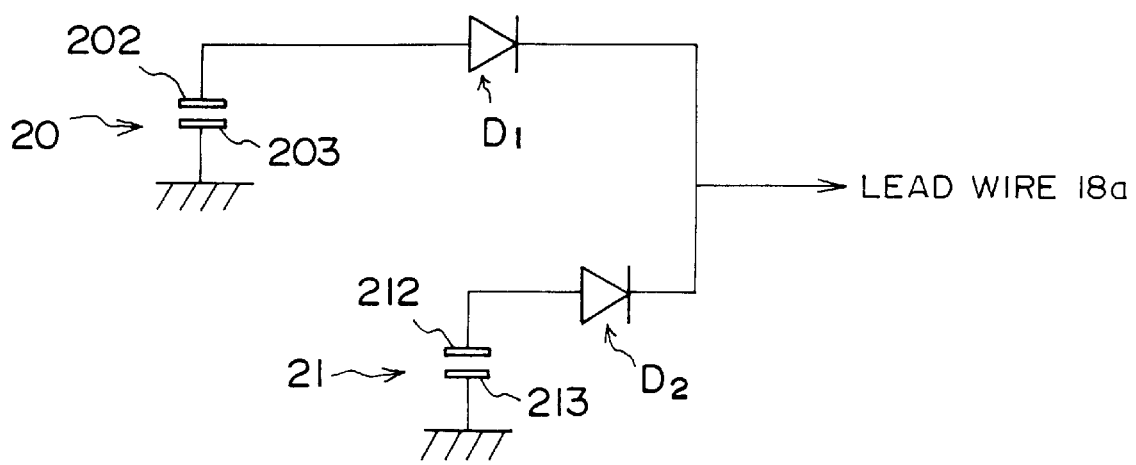
FIG. 5 is a circuit diagram illustrating circuitry between cell holders.

As shown in FIG. 5, diodes D1 and D2 are respectively connected to the positive-electrode plates 202 and 212 of the cell holders 20 and 21. The diodes D1 and D2 prevent a current from reversely flowing into the respective batteries set in the cell holders 20 and 21.

According to the cell holder unit as described above, when the batteries are set in the cell holders 20 and 21, electric power is supplied from the batteries to the circuitry formed on the circuit board 12 via the connector 24, the lead wires 18a and 18b, the dummy cell 16 and the cell holder 14. The cell holders 20 and 21 can be located at positions at which the batteries can be easily set in and removed from the cell holders 20 and 21 without touching the circuit board 12 in the electronic device 10.

The electric power is supplied, to the circuitry formed on the circuit board 12, from the cells set in the cell holders 20 and 21 which are connected in parallel. The capacity of a power source of the cells can be greater than the capacity of a power source of a single cell set in the cell holder 14 mounted on the circuit board 12.

The cell holder 20 and 21 are designed and made based on the configuration of the cells set in the cell holders 20 and 21. Thus, various types of cells (e.g., button-shaped cells, cylindrical cells and the like) can be used as the cells which are to be set in the cell holders 20 and 21. A set of the second connector element 24b and the supporting circuit board 25 on which the cell holders 20 and 21 are mounted can be easily changed. Thus, the set of the second connector element 24b and the supporting circuit board 25 is changeable to another set of second connector element 24b and supporting circuit board 25 on which cell holders for other types of cells are mounted, so that the type of cells which should be coupled to the circuitry formed on the circuit board 12 can be easily changed.

Figure 6:
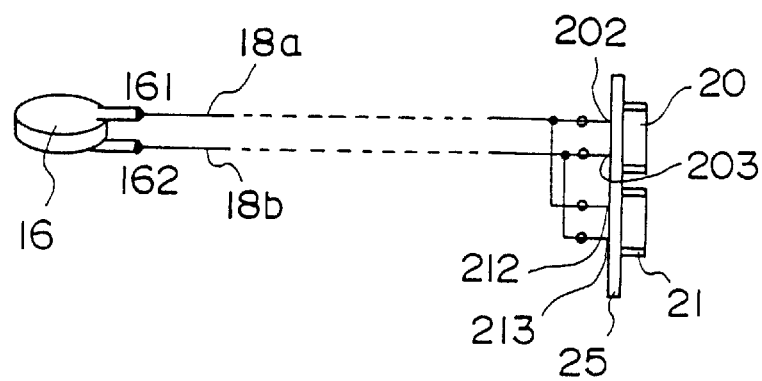
FIG. 6 is a diagram illustrating the cell holder unit according to another embodiment of the present invention.

The cell holder unit may be formed as shown in FIG. 6. Referring to FIG. 6, the lead wire 18a extending from the positive-electrode member 161 of the dummy cell 16 is directly connected to the positive-electrode plates 202 and 212 of the cell holders 20 and 21 in parallel. The lead wires 18b extending from the negative-electrode member 162 of the dummy cell 16 is directly connected to the negative-electrode plates 203 and 213 of the cell holders 20 and 21 in parallel. in this case, the connector 24 shown in FIG. 2 is not used, and the production cost of the cell holder can be decreased.

Figure 1:
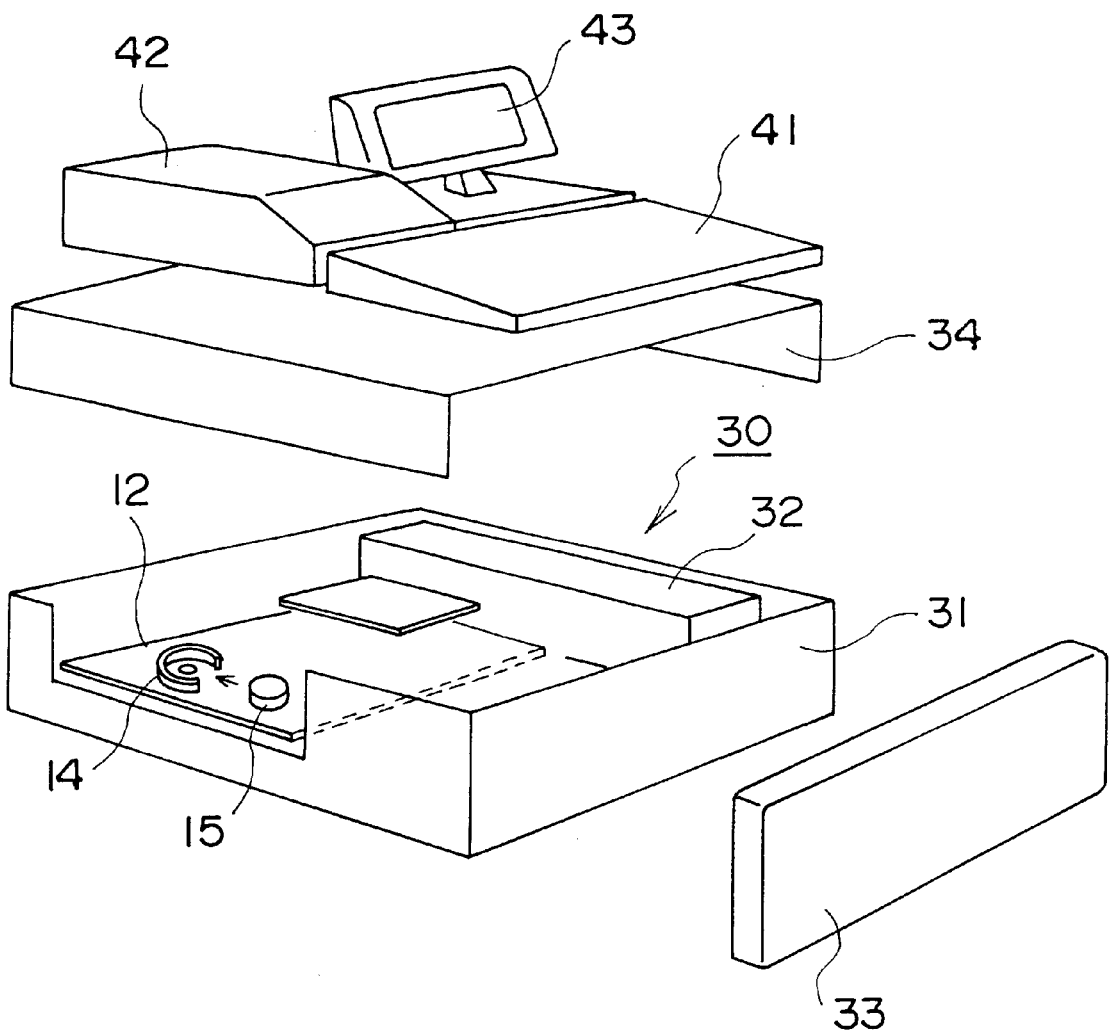
FIG. 1 is an exploded perspective view showing a conventional structure of a POS terminal.
Figure 7:
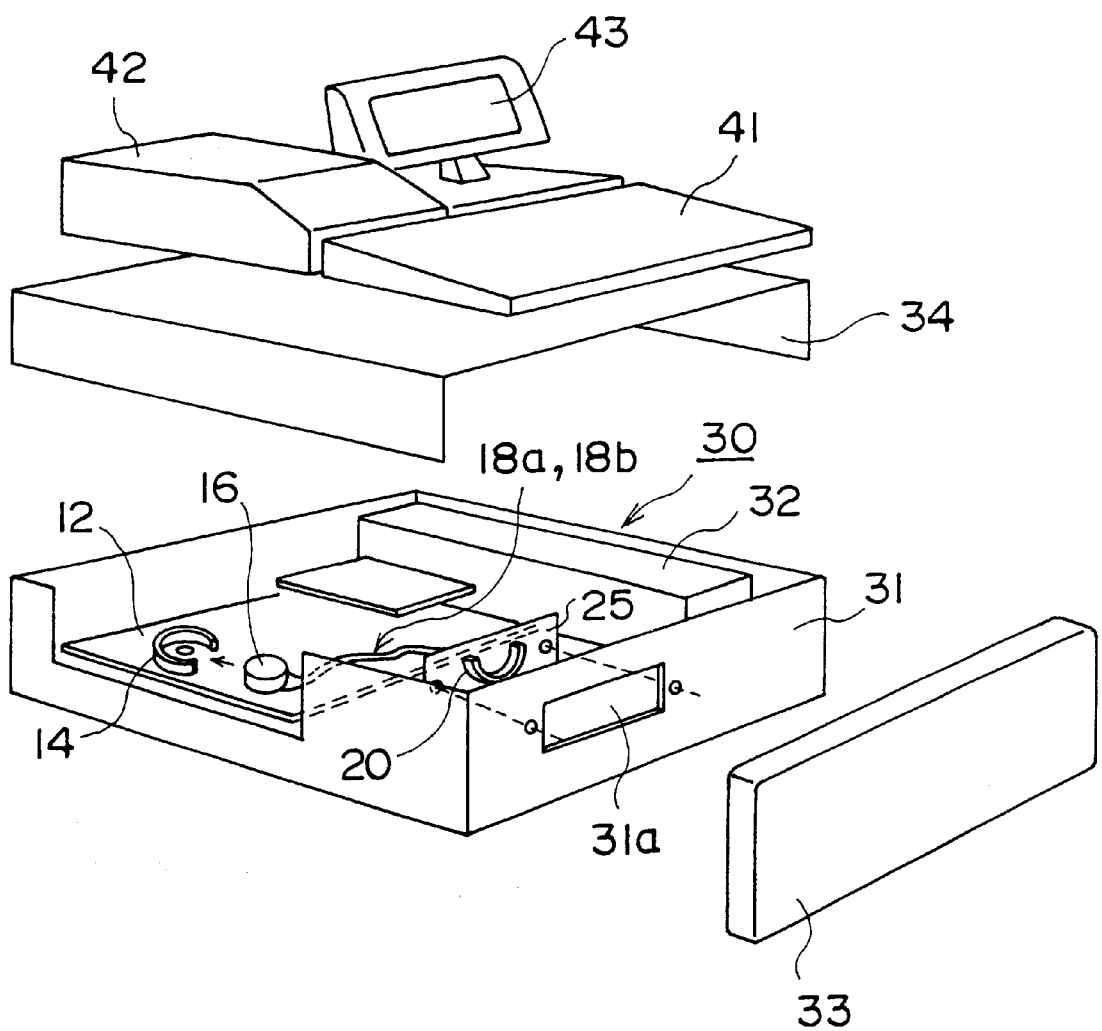
FIG. 7 is a exploded perspective view illustrating a POS terminal which is an electronic device according to an embodiment of the present invention.

A description will now be given, with reference to FIG. 7, of an electronic device according to an embodiment of the present invention. FIG. 7 shows a POS terminal. In FIG. 7, those parts which are the same as those shown in FIG. 1 are given the same reference numbers.

Referring to FIG. 7, the POS terminal 30 has the lower case 31, the power supply unit 32, the front panel 33, the upper cover 34, the keyboard 41, the printer unit 42 and the display unit 43. The power supply unit 32 and the circuit board 12 on which the cell holder 14 is mounted are housed in the lower case 31. The circuitry corresponding to functions of the POS terminal 30 is formed on the circuit board 12. The cell holder unit in which the dummy cell and the cell holder 20, fixed on the supporting circuit board 25, are electrically connected by the lead wires 18a and 18b is provided in the lower case 31. The cell holder unit has the same structure as that described above (see FIGS. 2, 3A, 3B, 4A and 4B) except for mounting only a single cell holder on the supporting circuit board 25. The dummy cell 16 is designed and made based on the cell holder 14 mounted on the circuit board 12 (the commercially available circuit board). A window 31a is formed on a front wall of the lower case 31. The dummy cell 16 is set in the cell holder 14 mounted on the circuit board 12. The supporting circuit board 25 is fixed on the front wall of the lower case 31 by screws (not shown) so that the cell holder 20 is exposed to the exterior of the lower case 31 through the window 31a. The upper cover 43 is put on the lower case 31 and the front panel 34 covers the front wall of the lower case 31. The cell (e.g., the lithium cell) set in the cell holder 20 of the cell holder unit is used, for example, as the back-up cell of the memory mounted on the circuit board 12.

In the POS terminal, when the front panel 33 is removed from the lower case 31, the cell set in the cell holder 20 is exposed. Thus, the cell for the circuitry formed on the circuit board 12 housed in the lower case 31 can be easily set in and removed from the cell holder 20 without removing the upper cover 34, the keyboard 41, the printer unit 42 and the display unit 43 from the lower case 31.

The present invention is not limited to the aforementioned embodiments, and other variations and modifications may be made without departing from the scope of the claimed invention.

What is claimed is:

1. A cell holder unit to be used for an electric device, comprising:

a plurality of first cell holders in which cells are removably set, each of said plurality of first cell holders having a first electrode and a second electrode both of which are in contact with a cell set therein;

a dummy cell, to be set in a second cell holder provided in the electric device, having a third electrode and a fourth electrode both of which are respectively in contact with electrodes of said second cell holder when said dummy cell is set in said second cell holder; and a connecting mechanism which electrically connects the first and second electrodes of each of said plurality of first cell holders to said third and fourth electrodes of said dummy cell, respectively.

2. The cell holder unit as claimed in claim 1, wherein said connecting mechanism comprises:

a first connector element;

lead wires which electrically connect the third and fourth electrodes of said dummy cell to said first connector element; and a second connector element which is electrically coupled to said first and second electrodes of each of said plurality of first cell holders, wherein said first connector element and said second connector element are removably connected to each other so that the third and fourth electrodes of said dummy cell are respectively electrically connected to the first and second electrodes of each of said plurality of first cell holders.

3. The cell holder unit as claimed in claim 1, wherein said plurality of first cell holders are mounted on a supporting circuit board.

4. An electric device, comprising:

a circuit board on which circuitry having functions applied to said electric device is formed;

a plurality of first cell holders in which cells are removably set, each of said plurality of first cell holders having a first electrode and a second electrode both of which are in contact with a cell set therein, wherein said plurality of first cell holders are integrated with a housing of said electric device so that the cells set in said plurality of first cell holders are changeable from outside of said housing without removing said plurality of first cell holders from said housing;

a second cell holder mounted on said circuit board;

a dummy cell, to be set in the second cell holder, having a third electrode and a fourth electrode both of which are respectively in contact with electrodes of said second cell holder when said dummy cell is set in said second cell holder; and a connecting mechanism which electrically connects the first and second electrodes of each of said plurality of first cell holders to said third and fourth electrodes of said dummy cell, respectively.

5. The electric device as claimed in claim 4, wherein said connecting mechanism comprises:

a first connector element;

lead wires which electrically connect the third and fourth electrodes of said dummy cell to said first connector element; and a second connector element electrically coupled to said first and second electrodes of each of said plurality of first cell holders, wherein said first connector element and said second connector element are removably connected to each other so that the third and fourth electrodes of said dummy cell are respectively electrically connected to the first and second electrodes of each of said plurality of first cell holders.

6. The electric device as claimed in claim 4, wherein said plurality of first cell holders are mounted on a supporting circuit board.

7. A cell holder unit comprising:

a holder unit having a plurality of first cell holders, electrically connected in parallel, in each of which a cell is removably set, each of said plurality of first cell holders having a first electrode and a second electrode which are respectively in contact with electrodes of the cell set therein;

an electrode unit which is to be set in a second cell holder which is mounted to a circuit board, said electrode unit having a third electrode and a fourth electrode which are respectively in contact with electrodes of said second cell holder when said electrode unit is set in said second cell holder; and a connecting mechanism which electrically connects the first and second electrodes of each of said plurality of first cell holders and the third and fourth electrodes of said electrode unit, respectively.

8. A cell holder unit comprising:

a holder unit having a plurality of first cell holders, electrically connected in parallel, in each of which a cell is removably set, each of said first cell holders having a first electrode and a second electrode which are respectively in contact with electrodes of the cell set therein;

an electrode unit which is to be set in a second cell holder which is mounted on a circuit board, said electrode unit having a third electrode and a fourth electrode which are respectively in contact with electrodes of said second cell holder when said electrode unit is set in said second cell holder; and a connecting mechanism which electrically connects the first and second electrodes of said plurality of first cell holders and the third and fourth electrodes of said electrode unit, respectively, said connecting mechanism including a first connector element;

lead wires which electrically connect the third and fourth electrodes of said electrode unit to said first connector element; and a second connector element which is electrically coupled to said first and second electrodes of each of said plurality of first cell holders, wherein said first connector element and said second connector element are removably connected to each other so that the third and fourth electrodes of said electrode unit are respectively electrically connected to the first and second electrodes of each of said plurality of first cell holders.

9. The cell holder unit as claimed in claim 8, wherein said plurality of first cell holders are mounted on a supporting circuit board.

10. An electronic device having a circuit board on which a first cell holder is mounted, circuitry formed on said circuit board having functions applied to said electronic device, said electronic device comprising:

a second cell holder in which a cell is removably set, having a first electrode and a second electrode which are respectively in contact with electrodes of the cell set therein, said second cell holder being integrated with a housing of said electronic device;

a unit which is set in said first cell holder, having a first electrode and a second electrode which are respectively in contact with electrodes of said first cell holder; and a connecting mechanism which electrically connects the first and second electrodes of said second cell holder and the first and second electrodes of said unit, respectively.

11. The electronic device as claimed in claim 10, wherein said unit is a dummy of a cell which is set in said first cell holder.

12. An electronic device having a circuit board on which a first cell holder is mounted, circuitry formed on said circuit board having functions applied to said electronic device, said electronic device comprising:

a second cell holder in which a cell is removably set, having a first electrode and a second electrode which are respectively in contact with electrodes of the cell set therein, said second cell holder being integrated with a housing of said electronic device;

a unit which is set in said first cell holder, having a first electrode and a second electrode which are respectively in contact with electrodes of said first cell holder; and a connecting mechanism which electrically connects the first and second electrodes of said second cell holder and the first and second electrodes of said unit, respectively, said connecting mechanism comprising a first connector element;

lead wires which electrically connect the first and second electrodes of said unit to said first connector element; and a second connector element electrically coupled to said first and second electrodes of said second cell holder, wherein said first connector element and said second connector element are removably connected to each other so that the first and second electrodes of said unit are respectively electrically connected to the first and second electrodes of said second cell holder.

13. The electronic device as claimed in claim 12, wherein said second cell holder is mounted on a supporting circuit board which is fixed on said housing of said electronic device.

* * * * *